United States Patent
Petit et al.

(10) Patent No.: US 8,299,854 B2
(45) Date of Patent: Oct. 30, 2012

(54) CIRCUIT FOR POWER AMPLIFICATION OF AN INPUT SIGNAL AND SIGNAL EMISSION SYSTEM INCORPORATING SUCH A CIRCUIT

(75) Inventors: Vincent Frédéric François Petit, Bazainville (FR); Bruno Louis, St Maur (FR); Rémi Luc Pierre Corbiere, Elancourt (FR)

(73) Assignee: Thales, Neuilly sur Seine (FR)

( * ) Notice: Subject to any disclaimer, the term of this patent is extended or adjusted under 35 U.S.C. 154(b) by 37 days.

(21) Appl. No.: 12/942,947

(22) Filed: Nov. 9, 2010

(65) Prior Publication Data
US 2011/0279182 A1 Nov. 17, 2011

(30) Foreign Application Priority Data
Nov. 10, 2009 (FR) ...................................... 09 05399

(51) Int. Cl.
*H03F 3/45* (2006.01)

(52) U.S. Cl. ....................................... 330/261; 330/257

(58) Field of Classification Search .................. 330/252, 330/257, 261
See application file for complete search history.

(56) References Cited

U.S. PATENT DOCUMENTS

| | | | | |
|---|---|---|---|---|
| 5,442,320 | A * | 8/1995 | Kunst et al. .................... | 330/267 |
| 5,757,233 | A * | 5/1998 | Kato et al. ..................... | 330/254 |
| 5,883,539 | A * | 3/1999 | Kimura ......................... | 330/261 |
| 5,986,509 | A | 11/1999 | Lohninger | |
| 2004/0000954 | A1 | 1/2004 | Kim et al. | |
| 2008/0079496 | A1 | 4/2008 | Thompson et al. | |

\* cited by examiner

*Primary Examiner* — Khanh V Nguyen
(74) *Attorney, Agent, or Firm* — Baker & Hostetler LLP

(57) ABSTRACT

A circuit for power amplification of an input signal includes an input stage and an output stage, the said input stage including: a drive means incorporating a so-called main drive transistor, and a first so-called main input transistor able to receive the input signal, and mounted as a current mirror with the main drive transistor The first main input transistor is coupled to the output stage via a second so-called main input transistor incorporated into the input stage and controlled by the drive means, the first and second main input transistors being coupled together and with the earth according to a structure of Darlington type by way of a resonant circuit

10 Claims, 1 Drawing Sheet

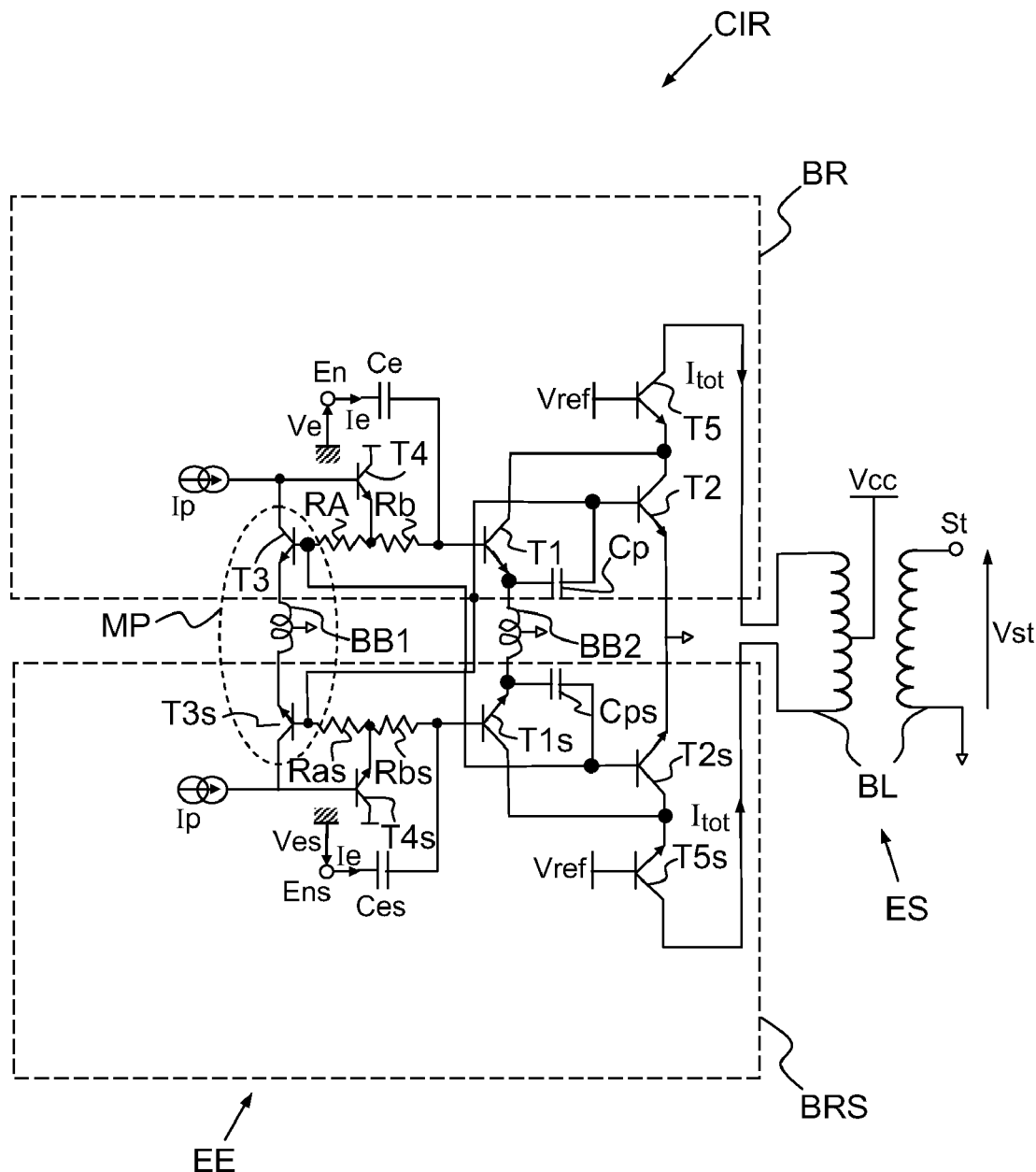

CIRCUIT FOR POWER AMPLIFICATION OF AN INPUT SIGNAL AND SIGNAL EMISSION SYSTEM INCORPORATING SUCH A CIRCUIT

CROSS-REFERENCE TO RELATED APPLICATION

This application claims priority to foreign French patent application No. FR 0905399, filed on Nov. 10, 2009, the disclosure of which is incorporated by reference in its entirety.

FIELD OF THE INVENTION

The invention pertains to a power amplification circuit, in particular embodied on silicon and able to process signals whose frequency lies in the X band (conventionally between 8 and 12 GHz).

BACKGROUND OF THE INVENTION

These circuits may for example be used in active transmit/receive modules, such as those integrated within radars. More precisely, these modules comprise microchips able to phase shift and attenuate or amplify the signal received or to be transmitted. The amplification function is carried out by the amplification circuit which ideally must be capable of providing the necessary power required while guaranteeing good linearity of the transmit/receive chain.

An ideal amplification circuit must notably:
provide the power level required at output,
disturb the other circuits coupled upstream as little as possible,
be sufficiently linear for the intended applications, and
allow control of the output gain,
all this with the lowest possible power consumption.

The amplification circuit is notably defined by its input impedance, its gain and its transition frequency.

So that the operation of the circuit is optimal, it is preferable for it to function in its linear operating zone, so as to benefit from maximum and controlled values of the amplification gain.

This linear operating zone is made up of the frequencies lying between 0 and the transition frequency Ft. The latter is defined by:

$$Ft = Fc * Gmax,$$

where:
Ft is the transition frequency,
Fc the cutoff frequency, and
Gmax, the maximum value that can be taken by the gain, in terms of current, of the amplification circuit.

To be able to deliver maximum output, it is necessary to function at frequency values for which the gain takes its maximum value, that is to say in the linear operating zone of the circuit.

Hitherto, in amplification circuits, working at high gain values implies a low input impedance, notably related to the use of a transistor self-biased by a current source, (for example a current mirror) and mounted in common emitter mode.

In this configuration (for transistors of judiciously chosen dimensions), the input impedance is expressed in the form:

$$Ze = \frac{\beta}{2gm}, \quad (1)$$

where:
Ze is the input impedance of the amplification circuit, and
β is the gain of the self-biased transistor.

The disadvantage of a low input impedance is that:
it is harmful to the coupling with another circuit disposed upstream, and
it decreases the value of the transition frequency, and consequently reduces the extent of the linear operating zone of the amplification circuit.

An aim of the invention is notably to solve these problems.

SUMMARY OF THE INVENTION

For this purpose, according to a first aspect of the invention, a circuit for power amplification of an input signal includes an input stage and an output stage, the said input stage comprising:
a drive means incorporating a so-called main drive transistor, and
a first so-called main input transistor able to receive the input signal, and mounted as a current mirror with the main drive transistor.

According to a general characteristic of this aspect, the first main input transistor is coupled to the output stage via a second so-called main input transistor incorporated into the input stage and controlled by the drive means, the first and second main input transistors being coupled together and with the earth according to a structure of Darlington type by way of a resonant circuit.

Stated otherwise, while preserving the amplifying function of the circuit, the structure of the self-biased transistor is notably replaced with a structure of Darlington type.

The invention thus makes it possible to increase the value of the input impedance of the circuit, and consequently, that of the transition frequency. The linear operating span is thus increased.

Moreover, on account of the use of a resonant circuit for the coupling of the first and second main transistors, the amplification circuit is able to process signals whose frequency lies in the X band.

According to one embodiment, the first and the second main input transistor may be configured so as to be traversed by currents of equivalent amplitude, to within an error.

For example, the said input signal may be of simple type, the said second main transistor then being controlled by the main drive transistor.

As a variant, the said input signal is of differential type, the input stage then furthermore comprising:
a so-called auxiliary drive transistor incorporated within the said drive means,
a first so-called auxiliary input transistor, and
a second so-called auxiliary input transistor,
each so-called auxiliary element being mounted symmetrically with the corresponding so-called main element.

According to one embodiment, the second main input transistor may be controlled by the main drive transistor, and the second auxiliary input transistor may be controlled by the auxiliary drive transistor.

As a variant, the second main input transistor may be controlled by the auxiliary drive transistor, and the second auxiliary input transistor may be controlled by the main drive transistor.

Preferably, the first and the second auxiliary input transistor may be configured so as to be traversed by currents of equivalent amplitude, to within an error.

According to one embodiment, the circuit may be embodied furthermore on silicon.

According to another aspect of the invention, there is proposed a signal emission/transmission system, incorporating a circuit as mentioned hereinabove.

According to another aspect of the invention, there is proposed a use of a signal emission/transmission system mentioned hereinabove, within a radar.

BRIEF DESCRIPTION OF THE DRAWING

Other advantages and characteristics of the invention will be apparent on examining the detailed description of a wholly non-limiting embodiment according to the invention and an appended single FIGURE wherein is represented an exemplary amplification circuit according to the invention.

DETAILED DESCRIPTION

The single FIGURE is now referred to. The reference CIR denotes an amplification circuit.

The latter comprises an input stage EE coupled to an output stage ES.

The input stage is here formed of two symmetric branches BR and BRS coupled together via two coils BB1 and BB2, as is described in greater detail hereinafter.

The circuit CIR comprises two branches BR and BRS since an input signal of differential type is considered. In the case of an input signal of simple type, the circuit CIR would naturally be formed of just one of the two branches.

The branch BR will be described in detail. To each so-called main element of the branch BR there corresponds a so-called symmetric auxiliary element within the branch BRS. The references of these auxiliary elements comprise a suffix "s", as represented in the FIGURE. So as to simplify the description, only the branch BR will be described, the branch BRS being similar thereto.

A bias current Ip is delivered as input to the input stage EE, both on the branch BR and on the branch BRS, given that an input signal of differential type is considered.

The differential input signal is applied in the form of a differential voltage VeVes, respectively to the input terminals En and Ens of the branches BR and BRS of the circuit CIR. More precisely, the differential input voltage is applied to the respective base of a first main transistor T1 and of a first auxiliary transistor T1s by way of two capacitors referenced Cp and Cps.

The bias current Ip is delivered as input to a main bias transistor T3, more precisely on its collector.

The main bias transistor T3 is mounted as a current mirror with the first main transistor T1. Stated otherwise, the base of the main bias transistor T3 is linked to the base of the first main transistor T1, here by way of two resistors Ra and Rb mounted in series. Their respective value may be of the order of some hundred ohms.

So as to limit the losses of the drive current transmitted by the main bias transistor T3, a transistor T4 is also connected between the current source delivering the bias current Ip and the node common to the two resistors Ra and Rb.

This transistor provides an additional, so-called base, current whose value corresponds to the value of the current dissipated by the main bias transistor T3.

The emitter of the main bias transistor T3 is linked by way of a coil BB1 to the emitter of the auxiliary bias transistor T3s. The two transistors T3 and T3s form a drive means MP.

Likewise, the emitter of the first main input transistor T1 is linked by way of a coil BB2 to the emitter of the first auxiliary input transistor T1s.

These coils BB1 and BB2 make it possible to decouple the transistors T3, T3s, T1 and T1s from the earth, by creating a high impedance at the working frequency.

Moreover, the coil BB2 forms a resonant circuit of LC type with the capacitor Cp, this resonant circuit coupling the transistors T1 and T2 together and with the earth symbolized by a white arrow. This resonant circuit enables the amplification circuit to process signals whose frequency lies in the X band.

More precisely, the first main input transistor T1 is mounted according to a structure of Darlington type, well known to the person skilled in the art, with a second main input transistor T2. Stated otherwise, the collector of the second main input transistor T2 is coupled to the collector of the first main input transistor T1. Moreover, the base of the second main input transistor T2 is coupled to the emitter of the first main input transistor T1 via a capacitor Cp.

The first and second main input transistors are configured in such a way that they are traversed by currents of similar values, to within an error.

More precisely, we have (for the branch BR):

$$Ze = \frac{Ve}{Ie},$$

where
Ze is the input impedance of the branch BR of the amplification circuit,
Ve the input voltage, and
Ie the input current.
Now:
$Ve = Vbe1 + Vbe2$, where
Vbe1 is the base/emitter voltage of the transistor T1, and
Vbe2 is the base/emitter voltage of the transistor T2.
For the sake of simplification, it is considered that Vbe1=Vbe2. It follows that:
$Ve = 2*Vbe2$.

Consequently, we obtain:

$$Ze = \frac{2Vbe}{Ib} = \frac{2Vbe}{\frac{Ic}{\beta}} = \frac{2Vbe}{gmVbe}*\beta = \frac{2\beta}{gm}, \qquad (2)$$

where:
Ib is the base current of the transistor T1 (or T2),
Ic is the collector current of the transistor T1 (or T2),
gm is the value of the transconductance of the transistor T1 (or T2), and
β is the gain of the transistor T2 (or T1).

The input impedance according to the invention (equation (2)) is thus much greater than the input impedance of the circuits according to the prior art (see equation (1) hereinabove), improving the coupling with an optional circuit coupled upstream.

Consequently, the current gain G of the branch BR of the circuit CIR can be written:

$$G = \frac{Itot}{Ie} = \frac{2*gm*\frac{Ve}{2}}{\frac{Ve}{Ze}} = Ze*gm,$$

where:
G is the current gain of the circuit CIR,
Itot is the total current delivered as output from the branch BR of the circuit CIR, Ie is the input current of the branch BR of the circuit,
gm is the value of the transconductance of the transistor T1 (or T2).

Thus, the increase in the value of the input impedance Ze implies an increase in the value of the current gain G of the circuit.

As:

$$Ft = \frac{jG}{2},$$

with Ft, the transition frequency, the increase in the current gain G does indeed imply an increase in the value of the transition frequency.

The same calculation applies to the branch BRS of the circuit CIR.

Thus, the extent of the linear operating zone of the circuit CIR is greatly increased. Consequently, it is possible to benefit from the maximum value of the gain of the circuit for a wider range of frequencies.

As illustrated in the FIGURE, the base of the second main input transistor T2 is linked to the base of the auxiliary bias transistor T3s.

Thus, the transistor is driven in dynamic mode by the first main input transistor T1. In static mode, the second main input transistor T2 is biased by the main bias transistor T3s.

As a variant, the base of the second main input transistor T2 may be linked to the base of the main bias transistor T3 and the base of the second auxiliary input transistor T2s linked to the base of the auxiliary bias transistor T3 (as illustrated in the FIGURE). The crossover illustrated in the FIGURE allows the variations in one branch to be passed on to the other branch and thus to preserve a perfectly symmetric differential signal.

Moreover, the second main input transistor T2 is cascode mounted with a transistor T5. The emitter of the second main input transistor T2 is earthed and its collector is coupled to the emitter of the transistor T5. The base of the emitter T5 is linked to a reference voltage terminal Vref.

The transistor T5 forms a buffer between the input stage EE and the output stage ES by:
  imposing a voltage on the collector of the second main input transistor T2,
  by limiting the impedance on the collector of the second main input transistor T2, and
  by limiting the circuit's Miller effect, that is to say, the influence of the amplification circuit's own gain on input characteristics, in particular, the reduction in the input impedance.

The collector of the transistor T5 is coupled to the output stage ES. The latter comprises for this differential mode a balun BL, that is to say an electrical circuit able to effect the link between parallel printed lines and a line printed above an earth plane.

The balun BL is powered by a supply voltage Vcc, and the output voltage between an output terminal St of the circuit CIR and the earth is referenced St.

The supply voltage Vcc is also used to power all the active elements of the circuit CIR. The connections are not represented for simplification reasons.

Another advantage of the amplification circuit CIR according to the invention is that it is particularly compact. Indeed, since the transistor T3 (or T3s depending on the configuration chosen) participates directly in the static biasing of the transistor T2 (or T2s), it is particularly advantageous to place it in proximity to the transistors T2 (or T2s). This results in a circuit of small proportions.

The transistors used in this example are of bipolar on silicon substrate type. It is also possible to use bipolar transistors on substrate of AsGa or InP type.

The invention claimed is:

1. A circuit for power amplification of an input signal comprising an input stage and an output stage, said input stage comprising:
  a drive means incorporating a main drive transistor, and
  a first main input transistor able to receive the input signal, and mounted as a current mirror with the main drive transistor,
  the first main input transistor being coupled to the output stage via a second main input transistor incorporated into the input stage and controlled by the drive means, the first and second main input transistors being coupled together and with earth according to a structure of Darlington type by way of a resonant circuit.

2. A circuit according to claim 1, wherein the first and the second main input transistor are configured so as to be traversed by currents of equivalent amplitude, to within an error.

3. A circuit according to claim 1, wherein said input signal is of simple type, said second main input transistor being controlled by the main drive transistor.

4. A circuit according to claim 1, wherein said input signal is of differential type, and in which the input stage further comprises:
  a auxiliary drive transistor incorporated within said drive means,
  a first auxiliary input transistor, and
  a second auxiliary input transistor, each auxiliary drive transistor, first main input transistor, and second main input transistor being mounted symmetrically with the corresponding main drive transistor, first main input transistor, and second main input transistor, respectively.

5. A circuit according to claim 4, wherein the second main input transistor is controlled by the main drive transistor, and the second auxiliary input transistor is controlled by the auxiliary drive transistor.

6. A circuit according to claim 4, wherein the second main input transistor is controlled by the auxiliary drive transistor, and the second auxiliary input transistor is controlled by the main drive transistor.

7. A circuit according to claim 4, wherein the first and the second auxiliary input transistor are configured so as to be traversed by currents of equivalent amplitude, to within an error.

8. A circuit according to claim 1, embodied furthermore on silicon.

9. A signal emission/transmission system, incorporating a circuit according to claim 1.

10. Use of a signal emission/transmission system according to claim 9, within a radar.

* * * * *